US006489706B2

(12) United States Patent
Sliwa, Jr. et al.

(10) Patent No.: US 6,489,706 B2
(45) **Date of Patent: *Dec. 3, 2002**

(54) MEDICAL DIAGNOSTIC ULTRASOUND TRANSDUCER AND METHOD OF MANUFACTURE

(75) Inventors: John W. Sliwa, Jr., Los Altos, CA (US); Rick L. Edmiston, State College; Matthew T. Spigelmyer, Furnace, both of PA (US); Vaughn R. Marian, Jr., Saratoga, CA (US); John P. Mohr, III, San Jose, CA (US); John A. Hossack, Palo Alto, CA (US)

(73) Assignee: Acuson Corporation, Mountain View, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/191,653

(22) Filed: Nov. 13, 1998

(65) Prior Publication Data

US 2001/0015592 A1 Aug. 23, 2001

(51) Int. Cl.[7] .................................... H01L 41/04
(52) U.S. Cl. .................................... 310/334
(58) Field of Search .................................... 310/334, 335, 310/336, 337; 600/459

(56) References Cited

U.S. PATENT DOCUMENTS

| | | | | | |
|---|---|---|---|---|---|
| 3,924,259 | A | * | 12/1975 | Butler et al. | 367/138 |
| 4,398,116 | A | * | 8/1983 | Lewis | 310/334 |
| 4,412,147 | A | | 10/1983 | Klicker et al. | |
| 4,870,867 | A | * | 10/1989 | Shaulov | 73/625 |
| 5,103,129 | A | * | 4/1992 | Slayton et al. | 310/335 |
| 5,295,487 | A | | 3/1994 | Saitoh et al. | |
| 5,316,000 | A | * | 5/1994 | Chapelon et al. | 128/660.03 |
| 5,402,791 | A | | 4/1995 | Saitoh et al. | |
| 5,546,946 | A | * | 8/1996 | Souquet | 600/459 |
| 5,769,079 | A | * | 6/1998 | Hossack | 660/454 |
| 5,906,580 | A | * | 5/1999 | Kline-Schoder et al. | 600/459 |
| 5,938,312 | A | * | 8/1999 | Kline-Schroder et al. | 600/459 |
| 5,944,666 | A | * | 8/1999 | Hossack et al. | 600/458 |
| 5,947,904 | A | * | 9/1999 | Hossack et al. | 600/458 |
| 6,020,675 | A | * | 2/2000 | Yamashita et al. | 310/358 |

OTHER PUBLICATIONS

Patrick D. Lopath, Seung–Eek Park, K. Kirk Shung and T.R. Shrout, *Ultrasonic Transducers Using Piezoelectric Single Crystal Perovskites;* pp 1–2.

Patrick D. Lopath, Seung–Eek Park, K. Kirk Shung and T.R. Shrout, Single Crystal Pb $(Zn_{1/3}Nb_{2/3})O_3/PbTiO_3$(PZN/PT) in *Medical Ultrasonic Transducers,* pp 1–4.

Josef Krautkräme and Herbert Krautkämer; *Ulrasonic Testing of Materials,* 4th Fully Revised Edition; 1990; pp 268–270.

T.R. Shrout, S.E. Park, C.A. Randall, J.P. Shepard, L.B. Hackenberger, D. Pickrell, and W.S. Hackenberger; *Recent Advances in Piezolectric Materials;* pp 1–12.

* cited by examiner

*Primary Examiner*—Thomas M. Dougherty
*Assistant Examiner*—Peter Medley
(74) *Attorney, Agent, or Firm*—Brinks Hofer Gilson & Lione; Craig Summerfield

(57) ABSTRACT

A plurality of piezomaterial bodies, such as panels or slices, are merged together to form a larger piezomaterial body. For example, a 0.75×22 cm polycrystalline piezomaterial body is formed, where the distances are along lateral or footprint dimensions. The thickness of the piezomaterial body is substantially less than either of the distances along first and second lateral dimensions that define the footprint. Preferably, each piezomaterial body has a panel shape, and a plurality of panels are merged to form a large multi-panel.

60 Claims, 5 Drawing Sheets

FIG. 2A
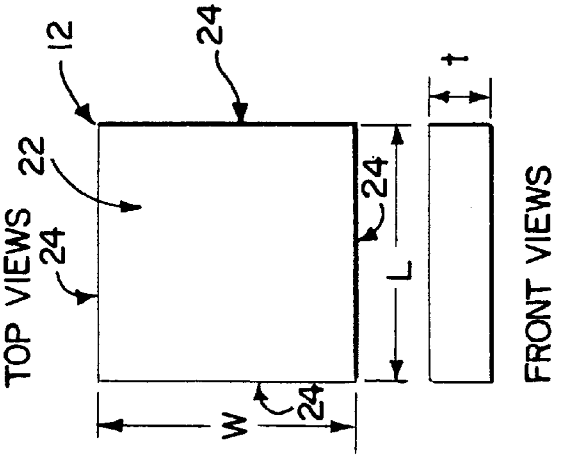
FIG. 2B
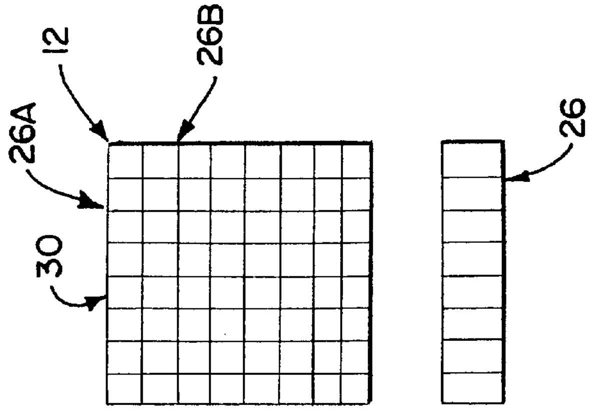
FIG. 2C
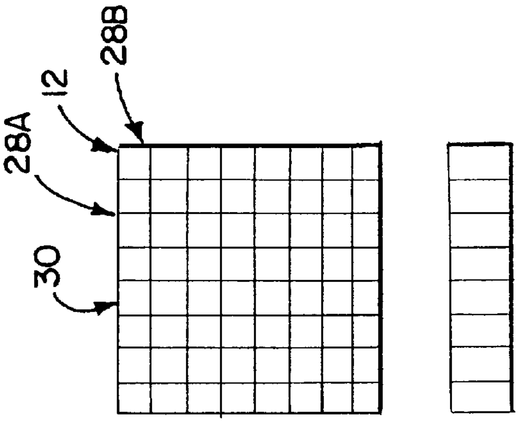
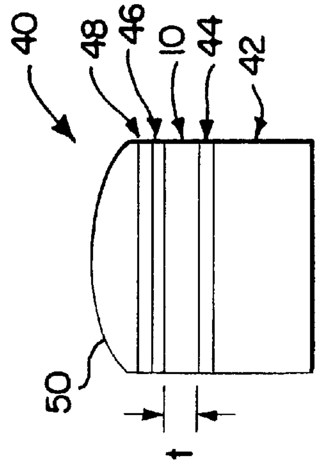
FIG. 4

SUB-PIECES ON SUPPORT BLOCK

DETAIL

MEDICAL DIAGNOSTIC ULTRASOUND TRANSDUCER AND METHOD OF MANUFACTURE

BACKGROUND OF THE INVENTION

This invention relates to ultrasound array transducers and methods for making such transducers. In particular, large transducers or transducers with large footprints are discussed below.

Transducers for medical ultrasound include a plurality of layers, such as an acoustic backing material layer, electrode layers, a layer of piezomaterial, an acoustic matching layer or layers, and a lens. The size of the largest manufacturable transducer is typically limited by the piezomaterial that is commercially available. The piezomaterial, such as polycrystalline PZT, is pressed and sintered or otherwise formed into a billet. The billet is sliced, and each slice is ground to a final thickness. The size of the ground slices is restricted by the fragility characteristics of piezomaterial as well as by the billet itself. As the slice size increases, the fragility characteristics lead to more manufacturing yield loss due to cracking and even destruction during use.

To prevent destruction of piezomaterial from handling and manufacturing, the ground slice of piezomaterial may be subjected to a compositing process. As disclosed in U.S. Pat. No. 4,412,148 to Klicker et al., the piezomaterial therein is formed or diced into isolated strips or posts, and the intervening gaps are filled with a polymer. The composited piezomaterial forms a flexible mat from the otherwise rigid billet or slice. However, the size of a composited piezomaterial is still limited by the size of the piezomaterial billet.

Other types of piezomaterials, such as monocrystalline PZT or PZN, often require further restriction of the size of the piezomaterial layer or slice. Monocrystalline PZT provides improved bandwidth for harmonic performance, but monocrystalline piezomaterials are made at present in single crystal billets of a much smaller size than pressed and sintered polycrystalline PZT powder (e.g. a maximum of ~1 cm×1 cm). Furthermore, monocrystalline piezomaterials are more prone to fracture during manufacture and use than polycrystalline materials. While compositing and other manufacturing processes, such as sintering, may result in more durable monocrystalline piezomaterials, the maximum available crystal size is still limited.

The piezomaterials discussed above are used to create an array of piezoelements for medical ultrasound image. Another use of piezomaterials is for non-destructive testing (NDT). It is known to create a crude mosaic of piezomaterials on a non-attenuative block, such as a metallic material, for allowing transmission of acoustic energy through the block into a workpiece under inspection. The block is placed against the material to be tested. Acoustic waves are generated by the piezomaterial and propagate through the nonattenuative block and into the material for testing. One prior art NDT transducer of this type has one mosaic "panel" of PZT per piezoelement and just a few elements in total. An attenuative backer is not used, but instead the sound beam is fired through the nonattenuative standoff—usually without any matching layer(s).

BRIEF SUMMARY

The present invention is defined by the following claims, and nothing in this section should be taken as a limitation on those claims. By way of introduction, the preferred embodiment described below includes a medical ultrasound transducer and a method for manufacturing the transducer.

A plurality of piezomaterial bodies, such as billets, slices or monocrystals, are merged together to form a larger piezomaterial body. For example, a 2 cm width×16 cm length footprint piezomaterial body is formed, from 8 2×2 cm subsections. The thickness, t, of the cojoined piezomaterial body is substantially less than either of the distances along first and second lateral dimensions, w and 1, that define the footprint. t is usually chosen to be approximately ¼ wavelength of the transducers center frequency and may typically be on the order of 1 mm or a fraction thereof. Preferably, each piezomaterial body or subsection has a panel shape, and a plurality of such panels may be merged to form a large multi-panel such as the 2×16 cm multipanel of 8 2×2 cm subsections.

Since the cost of laterally small bodies of piezomaterial is less per unit area, a large piezomaterial body may be constructed for a lesser cost by merging a plurality of small panels. The panels are merged prior to or during manufacture and lamination of the transducer.

In one aspect, a plurality of panels are merged to form a whole-breast transducer. In this embodiment, each panel comprises a polycrystalline piezomaterial body. Monocrystalline panels or paneling of polycrystals having differing frequency constants may also be employed in order to improve acoustic harmonic performance or for other reasons.

In one embodiment, two piezomaterial bodies are placed adjacent each other along lateral edges. The resulting larger piezomaterial body has the same thickness as the two individual piezomaterial bodies but a larger footprint area than either of the two piezomaterial bodies.

In another embodiment, a medical ultrasound transducer includes a backing block and at least one matching layer. A multi-panel of piezomaterial comprises at least first and second abutted panels. The multi-panel also includes a backing material side and a matching layer side. The backing material side comprises first and second abutted panel sides of the first and second panels, respectively. The matching layer side comprises third and fourth abutted panel sides of the first and second panels, respectively.

In yet another embodiment, a medical ultrasound transducer is made by providing at least first and second panels of piezomaterial. The two panels are abutted to form an elongated multi-panel. The elongated multi-panel is stacked with at least the backing material and a matching layer.

Further aspects and advantages of the invention are discussed below in conjunction with the preferred embodiments.

BRIEF DESCRIPTION OF THE DRAWINGS

FIGS. 2A–2C are top and side plan views of a piezomaterial body through various stages of a compositing process.

FIG. 4 is a side cross-sectional view of a medical ultrasound transducer.

FIG. 6 is a top plan view of a 1.5D or two-dimensional transducer.

FIG. 7 is a top plan view of a linear array with different sized piezoelectric panels with kerfs at different angles.

FIG. 8 is a side view of a multiple layer, multiple panel transducer.

FIG. 9 is a side view of a varying thickness of a piezoelectric panel.

FIG. 10 is a side view of a curved linear transducer.

DETAILED DESCRIPTION OF THE INVENTION

Figure 1B:
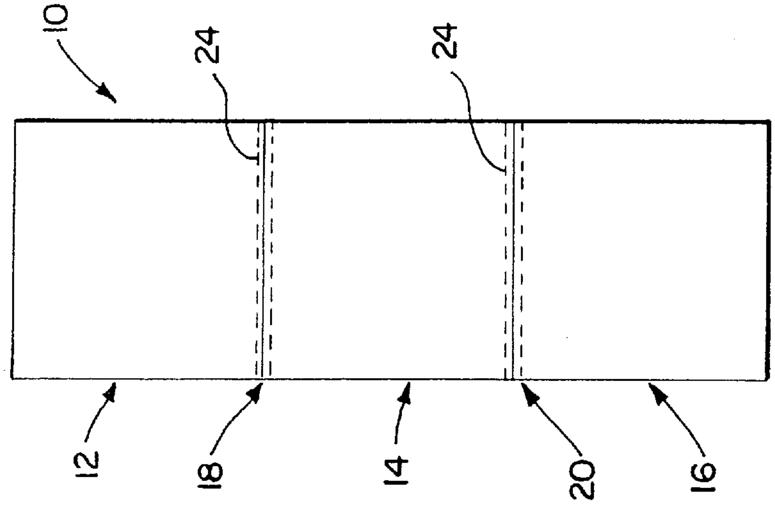
FIG. 1B is a top view of the three piezomaterial bodies of FIG. 1 abutted adjacent each other.

Referring to FIG. 1B, a top or footprint view of a large body of piezomaterial is shown generally as 10. In one preferred embodiment for breast imaging, the large piezomaterial body 10 is at least 0.7 cm in width, w, and 20 cm in length, 1, and is made up of two subpanels or smaller piezomaterial bodies. Smaller or larger piezomaterial bodies may be used. The piezomaterial body 10 comprises polycrystalline PZT, monocrystalline PZT or PZN or other material that exchanges acoustic and electrical energy.

Figure 1A:
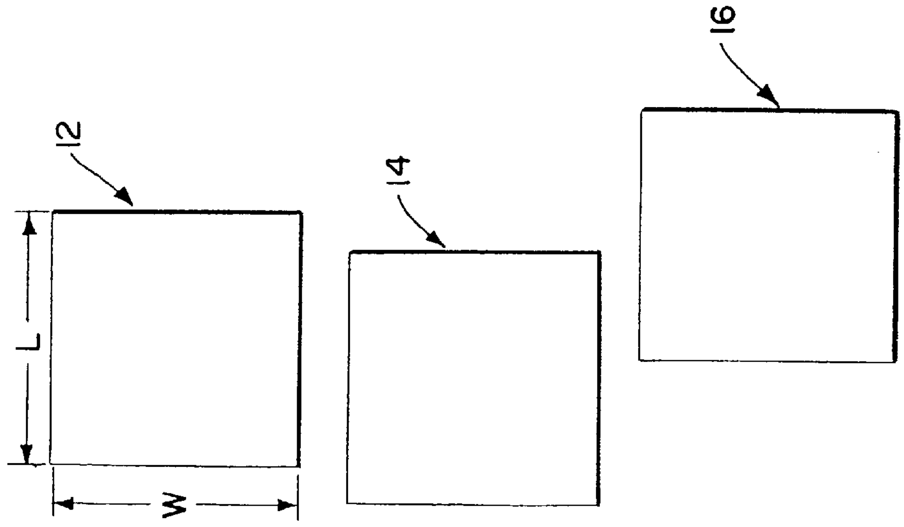
FIG. 1A is a top view of three piezomaterial bodies.

The piezomaterial body 10 of FIG. 1B includes three smaller piezomaterial bodies 12, 14, 16 joined at two junctions 18 and 20. For example, each smaller piezomaterial body 12, 14, 16 is a 2×2 cm polycrystalline or 1×1cm monocrystalline body. More or fewer smaller piezomaterial bodies 12, 14, 16 and junctions 18, 20 may be used. Referring to FIG. 1A, the smaller piezomaterial bodies 12, 14, 16 are shown separately. For example, each smaller piezomaterial body 12, 14, 16 comprises a slice, billet or crystal of piezomaterial. As used herein, a "smaller" piezomaterial body includes a piezomaterial body of any size that is lesser than the size of a piezomaterial body created from the smaller body and at least one other piezomaterial body. Each smaller piezomaterial body may be larger or smaller than another smaller piezomaterial body.

In one preferred embodiment, each piezomaterial body 10, 12, 14, 16 comprises a panel shape. By joining the smaller panels, a multi-panel or the larger piezomaterial body 10 is created. As used herein, "panel" includes slab-like or substrate-like and having lateral dimension(s) larger than the thickness dimension. Panels may also be somewhat nonplanar and/or have variable thickness.

Each smaller piezomaterial body 12, 14, 16 is formed in one of various shapes, such as a square, rectangular, triangular, hexagonal, diamond, other polygonal shapes, shapes including curves and any other shape. As used herein, the shape refers to the piezomaterial body 12, 14, 16 in the lateral dimensions or as viewed from the top or bottom (i.e. matching layer or backing block layer sides). Referring to FIG. 2A, the side 22 of piezomaterial body 12 adjacent either of the matching or backing block layers is shown as having a square shape. An area associated with the footprint of the piezomaterial body 12 is determined from the distances in each lateral dimensions as a function of the shape. In FIG. 2A, the area equals the square of the distance along an edge 24.

From a front view, the thickness, t, of the piezomaterial body 12 is shown. The thickness, t, is preferably substantially less than either of the lateral dimensions as shown in FIGS. 2A–C and is usually a function of the resonant frequency required for imaging. As used herein, substantially less includes t less than ½ the lateral length or width, with t typically in the range of 0.01–1.0 mm and 1 and w each in the range of 0.05–30 CM. A smaller or larger thickness may be used. The thickness may be uniform across both lateral dimensions. In alternative embodiments, the thickness varies as a function of one or both lateral dimensions. For example, one surface, such as the matching layer side, is concave along one lateral dimension to provide one or both of an elevation focus and better broadband and harmonic performance, such as shown in FIG. 9.

Referring to FIGS. 2A through 2C, each smaller piezomaterial body 12 may include kerfs 26, kerf filler material 28 or both. The kerfs and filler material 26 and 28 are produced as part of the compositing process such as described in the Klicker reference.

For compositing, a solid piece of piezomaterial, such as smaller piezomaterial body 12, is diced, scored, or otherwise cut to generate kerfs 26*a* and 26*b* as shown in FIG. 2B. The kerfs 26 may be spaced on a grid and usually have a spacing on the order of 0.1 t to 10 t. The kerfs 26 may create parallel edges at a uniform distance along the entire kerf 26. Preferably, the kerfs 26 are created using a dicing saw, a wire saw, a laser, or a directed liquid abrasive solution. The kerfs 26 may be produced in any of various patterns, such as the crisscross grid pattern shown. In alternative embodiments, the kerfs 26 are diced along parallel lines in only one lateral dimension. The kerfs 26 extend into or entirely through the smaller piezomaterial body 12. By dicing the smaller piezomaterial body 12, a plurality of piezomaterial posts 30 are created.

Referring to FIG. 2C, the compositing process is finished by filling, at least in part, the kerfs 26 between the posts 30. The posts 30 are at least partially isolated by the kerf filler material 28A/B. For example, a solid or semi-solid polymeric filler 28 A/B may be used, such as flexible polyurethane or urethane elastomer. In alternative embodiments, an epoxy may be used. After compositing, the smaller piezomaterial body 12 includes a plurality of posts 30 at least partially acoustically isolated along kerfs 26 by filler material 28. The composited piezomaterial body 12 will have reduced acoustic impedance and may be used on flat or curved surfaces, such as by bending the composite panel(s) on a curved backing material layer.

Figure 3:
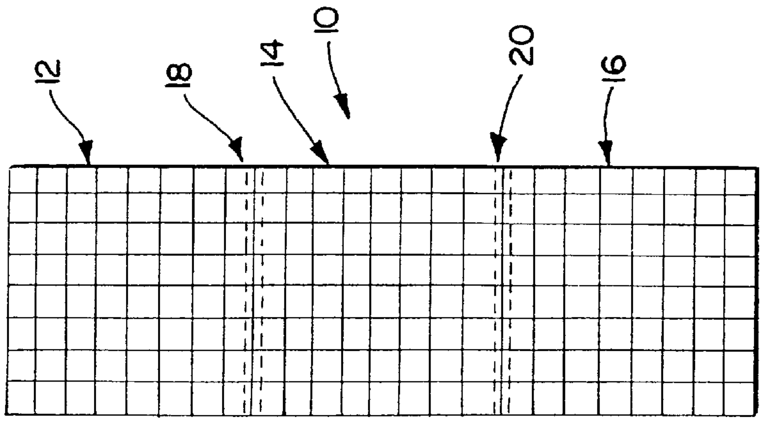
FIG. 3 is a top plan view of a composited multi-panel of piezomaterial.

Referring to FIGS. 1B and 3, the smaller piezomaterial bodies 12, 14, 16 are abutted together to form the larger piezomaterial body 10. The smaller piezomaterial bodies 12, 14, 16 are aligned and placed adjacent each other along one of the lateral edges 24. The abutted lateral edges 24 comprise the junctions 18, 20. The larger piezomaterial body 10 preferably comprises an area in the lateral dimensions that is approximately equal to the sum of the areas in the lateral dimensions of each of the smaller piezomaterial bodies 12, 14, 16. In alternative embodiments, the smaller piezomaterial bodies 12, 14, 16 overlap so that the area of the larger piezomaterial body 10 is larger than any one of the smaller piezomaterial bodies 12, 14, 16 but less than the sum of the areas, such as to form two or more layers.

In one embodiment, the width of the junctions 18, 20 is 0.2 to 1.5 of the thickness, t, of the piezomaterial body 10. Other widths of the junctions 18, 20 may be used. For example, the width of the junctions 18, 20 may be the same as, more or less than the width associated with a kerf 26 A/B (FIG. 2B). Preferably, the width is generally uniform, such that the lateral edges 24 of the smaller piezomaterial bodies 12, 14, 16 are generally parallel. The lateral edges 24 may be divergent, such as shown at 60 of FIG. 6. The width of the junctions 18, 20 may vary as a function of design or as a function of the manufacturing process. The lateral edges 24 may overlap at the junctions 18, 20 when viewed from the matching or backing material sides, such as would be associated with beveled edges. One or more of the lateral edges 24 may be shaped along parts of the entire thickness of the smaller piezomaterial bodies 12, 14, 16 to mate with another lateral edge 24. The junctions 18, 20 may or may not consist of an actual bonding or joining material.

The larger piezomaterial body 10 shown in FIG. 1B comprises three smaller piezomaterial bodies 12, 14, 16 in a linear configuration (i.e., N×1, where N is equal to 3). In other embodiments, four or more smaller piezomaterial bodies 12, 14, 16 are abutted in a linear combination to form the multi-panel or larger piezomaterial body 10. In yet other embodiments, an M×N two-dimensional array of smaller piezomaterial bodies 12, 14, 16 is formed for use as a one or two-dimensional array transducer, such as two-dimensional array shown in FIG. 6. For example, the array may comprise a two-dimensional array of hexagonal or diamond shaped panels or smaller piezomaterial bodies 12, 14, 16. The multi-panel or larger piezomaterial body 10 may comprise various lateral shapes, such as shapes extending along one or more curved paths in the lateral dimensions. In an M×N array, apertures, such as those associated with a missing smaller piezomaterial body 12, 14, 16, may be used to route interconnects or heat from or through the larger piezomaterial body 10.

In yet other embodiments, one or more additional layers of smaller piezomaterial bodies 12, 14, 16 are stacked on one or more underlying larger piezomaterial layer(s) 10 to increase the thickness or to provide a desired acoustic response, such as shown in FIG. 8. For example, two layers of piezomaterial are used for transmitting signals at a fundamental frequency from both layers and receiving echo signals from just one layer at a higher harmonic of the transmitted fundamental frequency.

One or more of the smaller piezomaterial bodies 12, 14, 16 may have different attributes than other smaller piezomaterial bodies 12, 14, 16. For example, the shape in one or both lateral dimensions, the thickness or variance in thickness, or the area in the lateral dimensions may be different. In one embodiment, one of the smaller piezomaterial bodies 12, 14, 16 is smaller in lateral area than another of the smaller piezomaterial bodies 12, 14, 16. As another example, the composition of one or more smaller piezomaterial body 12, 14, 16 may be different than one or more other smaller piezomaterial bodies 12, 14, 16, such as one smaller piezomaterial body 12, 14, 16 comprising polycrystalline PZT and another smaller piezomaterial body 12, 14, 16 comprising monocrystalline PZT. Smaller piezomaterial bodies 12, 14, 16 with differing frequency constants or differing electroacoustic properties may be mixed to obtain different acoustic performance in an area-wise manner. This approach can be used, for example, to broaden frequency performance and enhance harmonic content in the spectrum. Any subset of all of the smaller piezomaterial bodies 12, 14, 16 may be composited, include kerfs 26, different filler material, or different kerf patterns. As yet another example, a different amount of electrical poling may be used. By varying the degree of poling among the smaller piezomaterial bodies 12, 14, 16, elevational apodization may be controlled. One subset of smaller piezomaterial bodies 12, 14, 16 may comprise permanently poled piezomaterial, and the remaining smaller piezomaterial bodies 12, 14, 16 may comprise electrically biasable electrostrictive piezomaterial (i.e., poled when biased). These differences in composition, thickness or other properties of the smaller piezomaterial bodies 12, 14, 16 may be used to achieve variation in acoustic behavior as a function of position in the lateral (or thickness dimensions) within the larger piezomaterial body 10. In one embodiment, at least one location in each of two or more smaller piezomaterial bodies 12, 14, 16 has the same thickness, such as along the junctions 18, 20, as in another location in another smaller piezomaterial body 12, 14, 16.

Referring to FIG. 4, the larger piezomaterial body 10 is used in a unified (laminated) transducer array as generally shown at 40. The transducer 40 includes an acoustically attenuative backing material layer 42, an electrode layer 44, the larger piezomaterial body 10, a grounding electrode layer 46, one or more matching layers 48, and an acoustic lens layer 50, such as a silicone rubber lens layer. The backing material is preferably a cast or machined body of epoxy having one or both of a silica filler (to match impedance) and a plasticizer (to enhance attenuation). The matching layer may comprise an epoxy that is impedance controlled using a ceramic or metal filler. Other layer structures in a different order, with additional layers or without one or more of the above-listed layers, may be used. For example, one or more matching layers 48 are stacked adjacent the larger piezomaterial body 10, and the grounding electrode layer 46 is positioned between two acoustically conductive matching layers 48 or a matching layer and the lens layer 50. As another example, the transducer 40 does not include the lens layer 50. The various components are secured together to form the unified transducer array 40. The unified transducer array 40 operates and is moved as a single device. The transducer 40 may comprise a linear, a curved linear, a Vector®, a two dimensional, an I-beam, or other array transducer, such as shown in FIGS. 3, 6, 8 and 10. The various layers are designed as a function of the type of transducer. The transducer 40 may comprise a transducer for therapy, imaging or a combination of both uses.

The method of manufacturing the transducer 40 discussed above includes the steps of providing, abutting and joining the panels or smaller piezomaterial bodies 12, 14, 16. The multi-panel or larger piezomaterial body 10 created is stacked with other layers and laminated to create the transducer 40.

Two or more of the smaller piezomaterial bodies 12, 14, 16 are provided. As discussed above, each smaller piezomaterial body 12, 14, 16 may include the same or different composition, compositing, lateral dimension area, lateral dimension shape, poling, thickness variance and other attributes.

The smaller piezomaterial bodies 12, 14, 16 are abutted. If the smaller piezomaterial bodies 12, 14, 16 include kerfs 26, the kerfs 26 may be aligned from one smaller piezomaterial body 12, 14, 16 to the other smaller piezomaterial body 12, 14, 16. In alternative embodiments, the kerfs 26 of one smaller piezomaterial body 12, 14, 16 are aligned at an angle, such as between 0 and 90°, to the kerfs 26 on another smaller piezomaterial body 12, 14, 16, such as shown in FIG. 7. Preferably, the junctions 18, 20 created by abutting the smaller piezomaterial bodies 12, 14, 16 are aligned at a 0° or 90° angle to the kerfs 26. This alignment prevents chipping and cracking if further dicing or other cutting is performed, such as that associated with patterning electrodes.

The smaller piezomaterial bodies 12, 14, 16 are abutted and held in place by positioning in one of various alternatives. The smaller piezomaterial bodies 12, 14, 16 may be pre-bonded (attached) to a carrier tape, to the matching layer 48, to the electrode layer 46 or to another temporary or sacrificial carrier. In alternative embodiments, the smaller piezomaterial bodies 12, 14, 16 are abutted as the various layers of the transducer 40 are stacked. Other methods for positioning and holding the smaller piezomaterial bodies 12, 14, 16 may be used.

The abutted smaller uncomposited piezomaterial bodies 12, 14, 16 comprise the larger piezomaterial body 10. The larger piezomaterial body 10 may be composited (if desired). Compositing fills the junctions 18 and 20 and any kerf 26A/B with kerf filler material 28. In alternative embodiments, the larger piezomaterial body 10 is not composited, so the junctions 18 and 20 comprise air gaps, or the smaller piezomaterial bodies 12, 14, 16 are precomposited (see FIGS. 2A–2C) and the junctions 18, 20 are separately filled or left unfilled.

In yet other embodiments, the smaller piezomaterial bodies 12, 14 and 16 are actually joined. Joining is preferably performed prior to stacking the transducer 40. In alternative embodiments, the smaller piezomaterial bodies 12, 14, 16 are joined as part of the transducer stacking step.

Also prior to or during stacking, the smaller piezomaterial bodies 12, 14, 16 or the larger piezomaterial body 10 are metalized with a thin metallic film or plated to create at least a portion of or all of one or both of the electrode layers 44 and 46. The electrode layers 44 and 46 may also be formed during stacking of the transducer 40 or after placement on a carrier tape or the carrier matching layer 48. The electrode layers 44 and 46 are used to apply and sense an electrical bias across portions of the larger piezomaterial body 10. Preferably, the electrode layer 44 is diced or patterned to define a plurality of driven electrically addressable acoustic elements. For example, 128 different electrodes are created. Dicing for compositing and for patterning the electrode layer 44 may be performed with the same cuts. Preferably, at least two separate electrodes are provided on each of the smaller piezomaterial bodies 12, 14, 16, one ground electrode and one driven electrode. These electrodes are arranged to address individual acoustic piezoelements arrayed in each smaller piezomaterial body 12, 14, 16. A smaller piezomaterial body 12, 14, 16 may contain tens or even hundreds of addressable elements. Preferably, at least two electrically addressable elements are provided on each of the smaller piezomaterial bodies 12, 14, 16. Preferably, approximately 2l/t piezoelements exist within each smaller piezomaterial body 12, 14, 16, where l is the dimension of the subpanel along which piezoelements are arranged and t is the thickness.

Preferably, the piezomaterial connected to any one driving electrode is not connected to another electrode. For example, kerfs 26 separate each electrode and the associated posts 30. In one preferred embodiment, the multi-panel or larger piezomaterial body 10 is composited after joining, and the electrodes are formed over the composite structure. For example, each electrode extends the entire distance along one lateral dimension and covers one or more rows of posts 30 (usually several) along the other lateral dimension to form an acoustic array.

The various layers of the transducer 40 are stacked or mated and laminated. If the matching layer 48 is used as a piezomaterial carrier, the matching layer 48 and the larger piezomaterial body 10 are stacked simultaneously. Likewise, if the piezomaterial body 10 is metalized, then the electrode layers 44 and 46 are stacked simultaneously with the larger piezomaterial body 10. If a carrier tape (or other temporary carrier) is used, the carrier and any associated bonding residue is removed prior to stacking or after stacking and prior to lamination. The layers of the transducer 40 are then laminated to create the transducer 40.

Figure 5A:
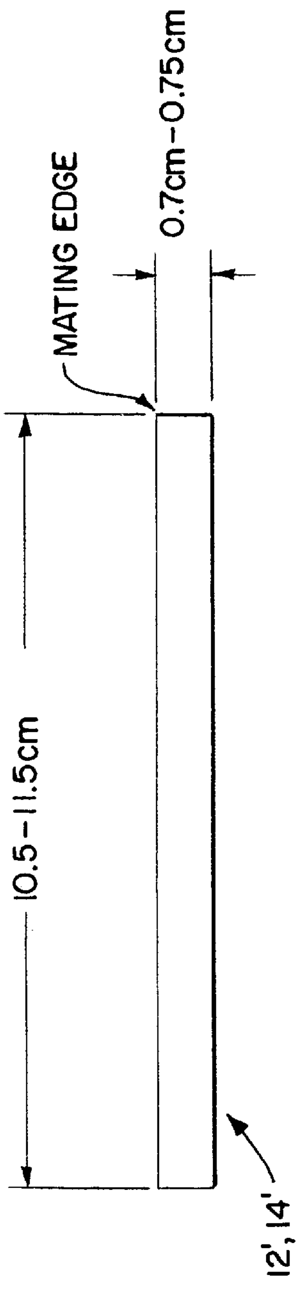
FIGS. 5A–H are various views of different aspects of a preferred embodiment of a breast transducer utilizing two subpanels of piezomaterial.
Figure 5B:
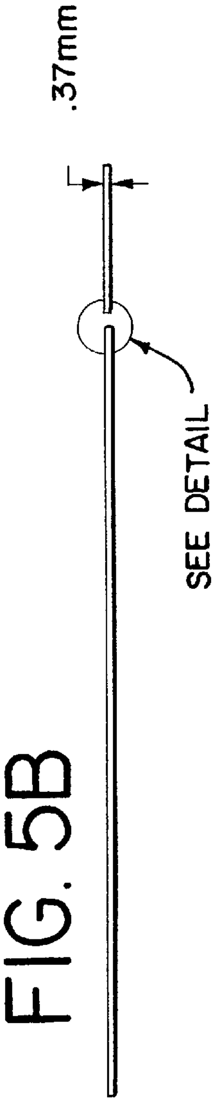
Figure 5C:
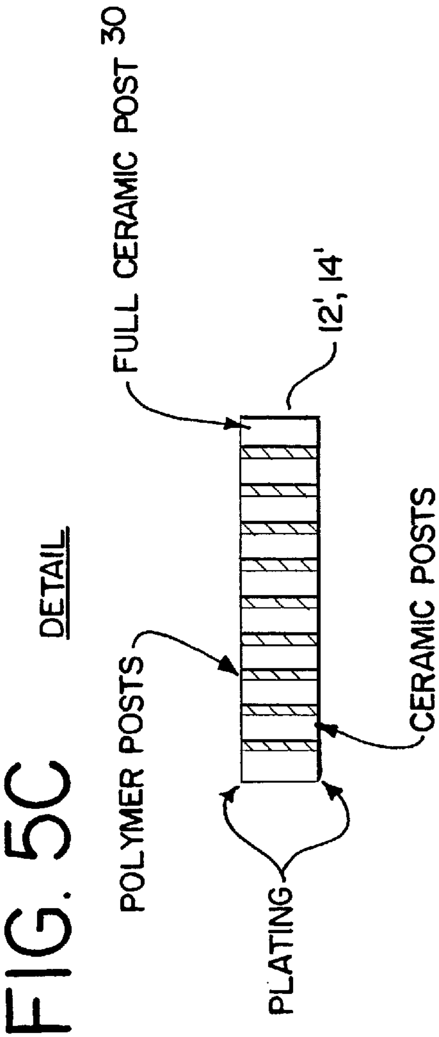
Figure 5D:
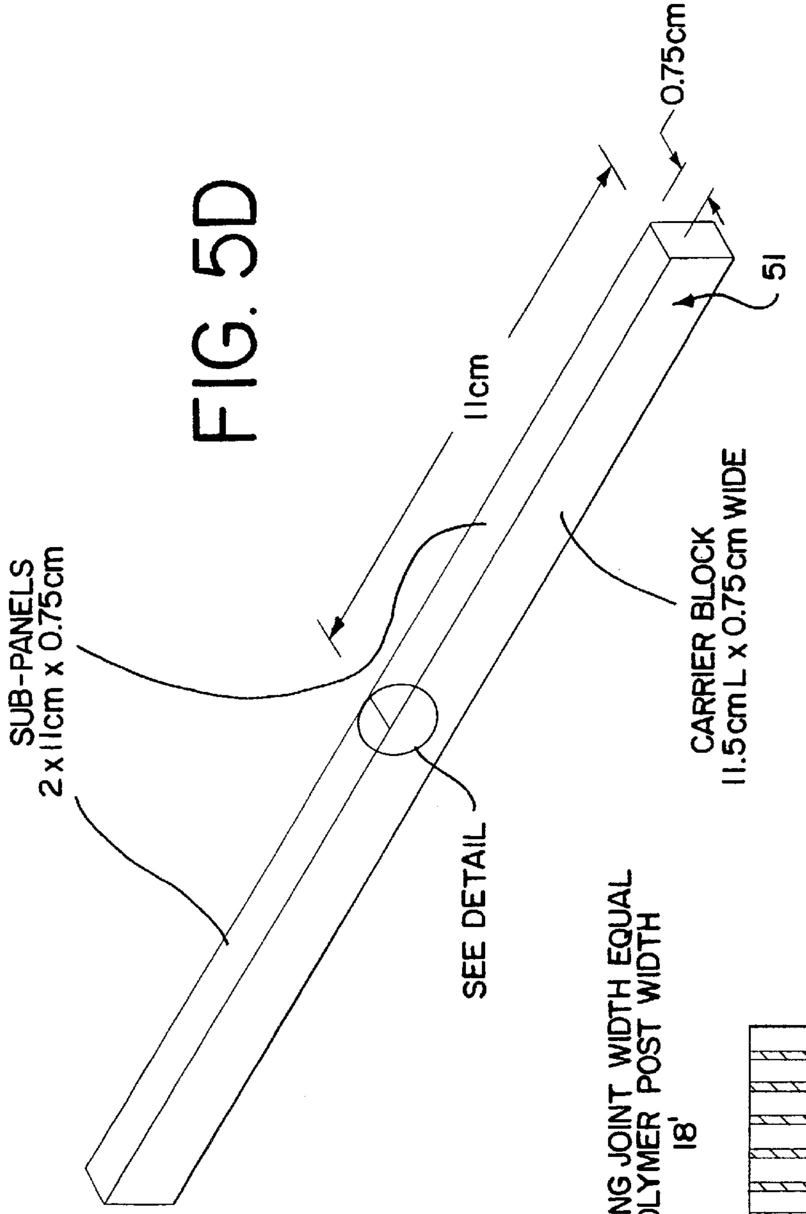
Figure 5E:
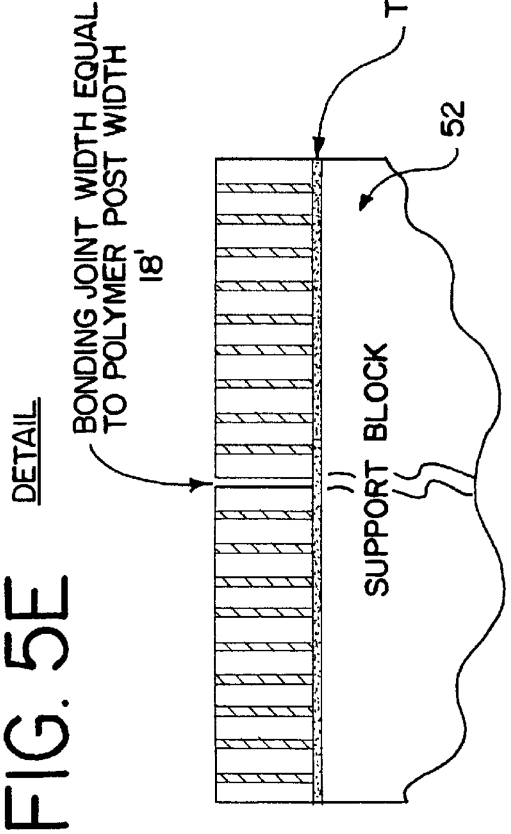
Figure 5F:
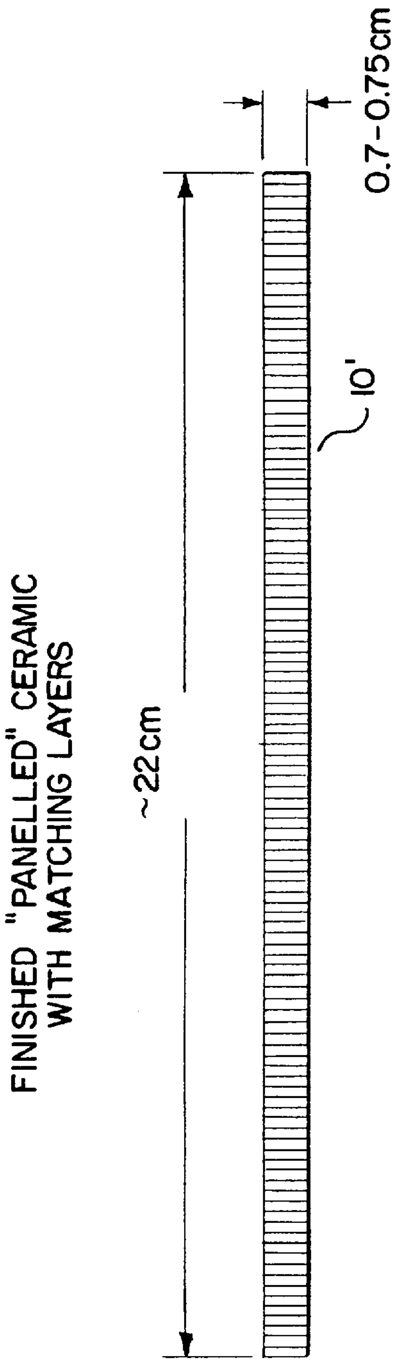
Figure 5G:
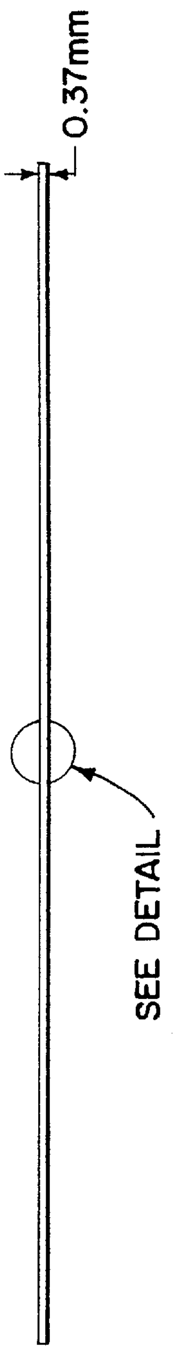
Figure 5H:
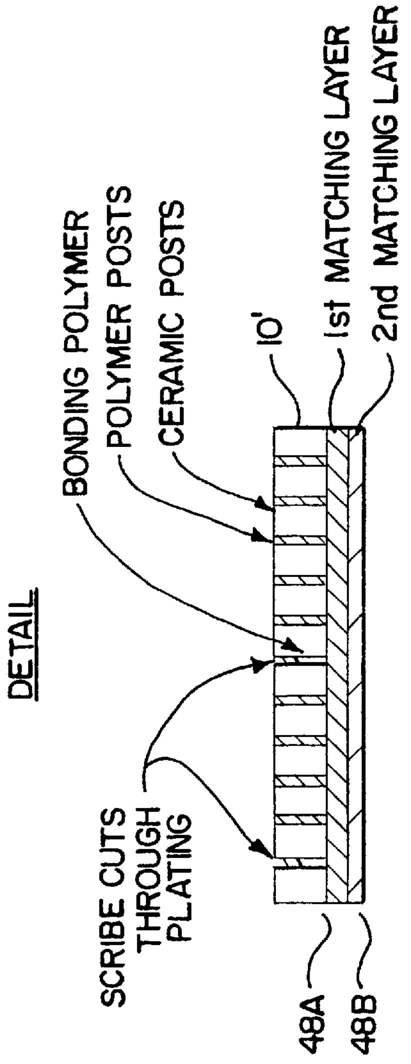

One preferred embodiment for application to breast imaging is depicted in FIGS. 5A–H. In FIGS. 5A–C, a subpanel 12' of polycrystalline precomposited PZT measures approximately 11.×0.7 cm and has a 0.37 mm thickness and a plating on its faces. In FIGS. 5D–E, 2 of the subpanels 12' are temporarily attached to a temporary metal carrier 51 using a transfer adhesive 52. The interpanel joint 18' is air-filled at this stage. In FIGS. 5F–H, two matching layers 48A, 48B are cast and ground upon the multipanel 10', and the carrier 51 is removed. The plating on a face opposite the matching layer 48A is cut to define electrically addressable elements. The multipanel 10 is then laminated. The casting of the matching layer 48A may cause the inter subpanel joint 18' to be filled and bonded such that the subpanels 12' of the multipanel 10' are physically bonded together.

While the invention has been described by reference to various embodiments, it will be understood that many changes and modifications can be made without departing from the scope of the invention. For example, more or fewer smaller piezomaterial bodies may be used. Different fabrication processes may be used.

It is therefore intended that the foregoing detailed description be understood as an illustration of the presently preferred embodiments of the invention, and not as a definition of the invention. It is only the following claims, including all equivalents, that are intended to define the scope of the invention.

What is claimed is:

1. A medical ultrasound transducer comprising:

a first piezomaterial body having a first thickness that is substantially less than either of first and second distances along first and second lateral dimensions, respectively, the first and second distances defining a first area;

a second piezomaterial body having a second thickness that is substantially less than either of third and fourth distances along the first and second lateral dimensions, respectively, the third and fourth distances defining a second area; and an acoustically attenuative backing material adjacent the first and second piezomaterial bodies;

wherein a first lateral edge of the first piezomaterial body is adjacent a second lateral edge of the second piezomaterial body, a lateral area of the adjacent first and second adjacent piezomaterial bodies greater than either of the first and second areas, the first and second peizomaterial bodies forming a one dimensional array of elements, the lateral area being rectangular.

2. The transducer of claim 1 wherein the lateral area of the first and second adjacent piezomaterial bodies is substantially the same as a sum of the first and second areas.

3. The transducer of claim 1 wherein the first and second piezomaterial bodies comprise monocrystalline piezomaterial and the lateral area of the first and second adjacent piezomaterial bodies is greater than 2 $cm^2$.

4. The transducer of claim 1 wherein a lateral dimension of the combined bodies is greater than 15 cm and the bodies comprise polycrystalline piezomaterial.

5. The transducer of claim 1 wherein at least the first piezomaterial body comprises a panel.

6. The transducer of claim 1 wherein at least the first piezomaterial body comprises polycrystalline piezomaterial.

7. The transducer of claim 1 wherein at least the first piezomaterial body comprises monocrystalline piezomaterial.

8. The transducer of claim 1 wherein the first and second lateral edges are divergent.

9. The transducer of claim 1 wherein at least the first piezomaterial body comprises a composited body.

10. The transducer of claim 9 wherein kerfs in the first piezomaterial body have a lesser width than a distance between the first and second lateral edges.

11. The transducer of claim 9 wherein a kerf in the first piezomaterial body is associated with two substantially parallel edges, and the first and second lateral edges are divergent.

12. The transducer of claim 9 wherein kerfs in the first piezomaterial body are parallel to kerfs in the second piezomaterial body.

13. The transducer of claim 9 wherein kerfs in the first piezomaterial body are at an angle between 0 and 90 degrees to kerfs in the second piezomaterial body.

14. The transducer of claim 1 further comprising at least a third piezomaterial body.

15. The transducer of claim 14 wherein the first, second and at least third piezomaterial bodies are aligned in an N by 1 configuration in the lateral dimensions, where N is the number of piezomaterial bodies.

16. The transducer of claim 14 wherein the first, second and at least third piezomaterial bodies are aligned in an N by M configuration in the lateral dimensions, where N and M are numbers of piezomaterial bodies, where N and M are greater than one and the piezomaterial bodies comprise two adjacent single one dimensional arrays of elements which define a two-dimensional array.

17. The transducer of claim 14 wherein the at least third piezomaterial body is stacked on at least one of the first and second piezomaterial bodies, the at least one first or second piezomaterial body and the at least third piezomaterial body comprising a two layer body.

18. The transducer of claim 1 wherein at least the first thickness varies as a function of at least one of the first and second lateral dimensions.

19. The transducer of claim 1 wherein the first and second piezomaterial bodies have at least one common value of thickness at least one location.

20. The transducer of claim 1 wherein the first piezomaterial body comprises a composition different than the second piezomaterial body.

21. The transducer of claim 1 wherein the first piezomaterial body is associated with a different degree of poling than the second piezomaterial body.

22. The transducer of claim 1 wherein at least two separate electrodes connect to the first piezomaterial body.

23. The transducer of claim 1 wherein at least two electrodes contact at least two respective electrically addressable piezoelements in said first body.

24. The transducer of claim 1 wherein the transducer comprises a type selected from the group consisting of: linear, curved linear, and two-dimensional arrays.

25. The transducer of claim 1 wherein the first piezomaterial body comprises a lateral shape selected from the group consisting of: square, rectangular, multi-sided, and combinations thereof.

26. The transducer of claim 1 wherein at least one piezomaterial body has enhanced harmonic performance provided by at least one of variable thickness and monocrystalline piezomaterial.

27. A medical ultrasound transducer comprising:

a multi-panel of piezomaterial comprising:

at least first and second abutted panels comprising a one dimensional array of elements, the at least first and second abutted panels having a combined rectangular area, each of the first and second abutted panels associated with two or more elements of the one dimensional array; and a backing material side and a matching layer side, the backing material side comprising first and second abutted panel sides of the first and second panels, respectively, the matching layer side comprising third and fourth abutted panel sides of the first and second panels, respectively;

an acoustically attenuative backing material adjacent the backing material side; and at least one matching layer adjacent the matching layer side.

28. The transducer of claim 27 wherein:

the first panel comprises a first thickness that is substantially less than either of first and second distances along first and second lateral dimensions, respectively; and the second panel comprises a second thickness that is substantially less than either of third and fourth distances along the first and second lateral dimensions, respectively.

29. The transducer of claim 27 wherein at least the first panel comprises moncrystalline piezomaterial.

30. The transducer of claim 27 wherein the multi-panel comprises polycrystalline piezomaterial and a lateral dimension of the multi-panel is greater than 15 cm.

31. The transducer of claim 30 wherein a second lateral dimension is less than 1 cm.

32. The transducer of claim 27 wherein at least the first panel comprises moncrystalline piezomaterial.

33. The transducer of claim 27 wherein a kerf in the first panel have a lesser width than a distance between the first and second panels.

34. The transducer of claim 27 wherein a kerf in the first panel is associated with two substantially parallel edges, and abutting edges of the first and second panels are divergent.

35. The transducer of claim 27 wherein the first panel comprises a composition different than the second panel.

36. The transducer of claim 27 wherein at least two separate electrodes connect to the first panel and at least two electrodes connect to the second panel.

37. The transducer of claim 27 wherein at least two electrodes contact at least two respective piezoelements in said first panel.

38. The transducer of claim 27 wherein at least the first panel has enhanced harmonic performance provided by one of variable thickness and monocrystalline piezomaterial.

39. A medical ultrasound transducer comprising;

an acoustically attenuative backing material;

at least one matching layer; and a monocrystalline piezomaterial element comprising at least 2 $cm^2$ area on a matching layer side;

wherein the piezomaterial element is laminated between the backing material and the at least one matching layer.

40. The transducer of claim 39 wherein the piezomaterial element comprises at least first and second abutted panels.

41. The transducer of claim 39 wherein:

the piezomaterial element comprises at least first and second piezomaterial bodies;

the first piezomaterial body comprises a first thickness that is substantially less than either of first and second distances along first and second lateral dimensions, respectively, the first and second distances defining a first area that is less than or equal to 1 $cm^2$; and the second piezomaterial body comprises a second thickness that is substantially less than either of third and fourth distances along the first and second lateral dimensions, respectively, the third and fourth distances defining a second area that is less than or equal to 1 $cm^2$.

42. A method of manufacturing a medical ultrasound transducer, the method comprising the steps of:

(a) providing at least first and second panels of piezomaterial;

(b) abutting the at least first and second panels of piezomaterial, the abutted at least first and second panels comprising a laterally extended multi-panel of a one dimensional array of elements, the laterally extended multi-panel being rectangular; and (c) mating the multi-panel with an acoustically attenuative backing material and at least one matching layer.

43. The method of claim 42 further comprising step (d) of compositing at least one of the first and second panels prior to step (b).

44. The method of claim 42 wherein step (b) comprises abutting the at least first and second panels so that a matching layer side area of the multi-panel is greater than either of first and second matching layer side areas of the first and second panels, respectively.

45. The method of claim 42 further comprising step (d) of compositing the first and second panels after step (b).

46. The method of claim 42 wherein any one of steps (a) and (b) are performed before step (c).

47. The method of claim 46 further comprising step (d) of metalizing the multi-panel before step (c) is completed.

48. The method of claim 46:

further comprising step (d) of attaching the at least first and second panels to a matching layer; and wherein step (c) comprises mating the multi-panel and the matching layer to at least the acoustically attenuative backing material.

49. The method of claim 48 wherein the at least first and second panels are bonded to the matching layer.

50. The method of claim 42 wherein step (b) is performed as part of step (c).

51. The method of claim 50 wherein step (b) comprises placing the at least first and second panels on a carrier tape before step (c).

52. The method of claim 43 wherein step (b) comprises abutting the at least first and second composited panels so that kerfs on the first panel are at an angle between 0 and 90 degrees to kerfs on the second panel.

53. The method of claim 43 wherein step (b) comprises abutting the at least first and second composited panels so that kerfs on the first panel are parallel to kerfs on the second panel.

54. The method of claim 42 wherein step (c) comprises providing the multipanel comprising as a monocrystalline piezomaterial and comprising a matching layer surface area of at least 2 $cm^2$.

55. The method of claim 42 wherein step (a) comprises providing the at least first and second panels as monocrystalline piezomaterial.

56. The method of claim 42 further comprising step (e) of providing at least two electrodes on the first panel and at least two electrodes on the second panel.

57. The method of claim 42 wherein the ultrasound transducer has enhanced harmonic performance contributed by at least one of monocrystalline PZT and variables thickness in at least one piezomaterial panel.

58. The method of claim 42 wherein at least one panel comprises at least two electrically addressable piezoelements.

59. A medical ultrasound transducer comprising:

a first piezomaterial body having a first thickness that is substantially less than either of first and second distances along first and second lateral dimensions, respectively, the first and second distances defining a first area;

a second piezomaterial body having a second thickness that is substantially less than either of third and fourth distances along the first and second lateral dimensions, respectively, the third and fourth distances defining a second area;

an acoustically attenuative backing material adjacent the first and second piezomaterial bodies; and wherein a first lateral edge of the first piezomaterial body is adjacent a second lateral edge of the second piezomaterial body, a lateral area of the adjacent first and second adjacent piezomaterial bodies greater than either of the first and second areas, the first and second peizomaterial bodies forming an array absent intersection with another array.

60. A medical ultrasound transducer comprising:

a first monocrystalline piezomaterial body having a first thickness that is substantially less than either of first and second distances along first and second lateral dimensions, respectively, the first and second distances defining a first area;

a second monocrystalline piezomaterial body having a second thickness that is substantially less than either of third and fourth distances along the first and second lateral dimensions, respectively, the third and fourth distances defining a second area; and an acoustically attenuative backing material adjacent the first and second piezomaterial bodies;

wherein a first lateral edge of the first piezomaterial body is adjacent a second lateral edge of the second piezomaterial body, a lateral area of the adjacent first and second adjacent piezomaterial bodies greater than either of the first and second areas and greater than 2 $cm^2$.

* * * * *